United States Patent
Ishii et al.

(10) Patent No.: US 10,871,522 B2
(45) Date of Patent: Dec. 22, 2020

(54) CELL CALCULATION APPARATUS AND METHOD FOR CALCULATING AN OPEN-CIRCUIT VOLTAGE OF A CELL

(71) Applicant: KABUSHIKI KAISHA TOSHIBA, Tokyo (JP)

(72) Inventors: Ena Ishii, Kanagawa (JP); Nobukatsu Sugiyama, Kanagawa (JP); Mitsunobu Yoshida, Kanagawa (JP); Tomokazu Morita, Chiba (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 791 days.

(21) Appl. No.: 14/561,716

(22) Filed: Dec. 5, 2014

(65) Prior Publication Data

US 2015/0160300 A1 Jun. 11, 2015

(30) Foreign Application Priority Data

Dec. 6, 2013 (JP) .................. 2013-253555

(51) Int. Cl.
*G01R 31/36* (2020.01)
*G01R 31/3842* (2019.01)
(Continued)

(52) U.S. Cl.
CPC ..... *G01R 31/3842* (2019.01); *G01R 31/3648* (2013.01); *H01M 10/482* (2013.01);
(Continued)

(58) Field of Classification Search
CPC ............. H01M 10/441; H01M 10/052; H01M 10/482; G01R 31/3648; G01R 31/3842; G01R 31/396
(Continued)

(56) References Cited

U.S. PATENT DOCUMENTS 7,576,545 B2   8/2009 Singh et al.
2002/0109506 A1 8/2002 Kawakami et al.
(Continued)

FOREIGN PATENT DOCUMENTS

CN   1340874 A   3/2002
CN   1549385 A   11/2004
(Continued)

OTHER PUBLICATIONS

Office Action in counterpart Taiwanese Application No. 103141975, pp. 1-6, dated Jun. 8, 2016.
(Continued)

*Primary Examiner* — Gene N Auduong
(74) *Attorney, Agent, or Firm* — Finnegan, Henderson, Farabow, Garrett & Dunner, L.L.P.

(57) ABSTRACT

According to an embodiment, a cell state calculation apparatus includes the following elements. The database stores a function indicating a relationship between a voltage and a charged capacity of an active material. The active material amount calculation unit calculates an amount of an active material of the secondary cell by referring to the database and by using the voltage detected by the voltage detector and the current detected by the current detector while the secondary cell is charged or discharged. The open circuit voltage calculation unit calculates a function indicating a relationship between an open circuit voltage and a charged capacity of the secondary cell by referring to the database and by using the calculated amount of the active material.

18 Claims, 16 Drawing Sheets

(51) Int. Cl.
*H01M 10/48* (2006.01)
*H01M 10/44* (2006.01)
*H01M 10/052* (2010.01)
*G01R 31/396* (2019.01)

(52) U.S. Cl.
CPC ......... *G01R 31/396* (2019.01); *H01M 10/052* (2013.01); *H01M 10/441* (2013.01)

(58) Field of Classification Search
USPC .......................................................... 702/63
See application file for complete search history.

(56) References Cited

U.S. PATENT DOCUMENTS

| | | | |
|---|---|---|---|
| 2005/0035743 | A1 | 2/2005 | Kawakami et al. |
| 2010/0153038 | A1 | 6/2010 | Tomura et al. |
| 2011/0119005 | A1 | 5/2011 | Majima et al. |
| 2012/0130661 | A1 | 5/2012 | Hagimori et al. |
| 2012/0310566 | A1 | 12/2012 | Hoshino et al. |
| 2013/0030739 | A1 | 1/2013 | Takahashi et al. |
| 2013/0060497 | A1 | 3/2013 | Bito |
| 2013/0138369 | A1 | 5/2013 | Papana et al. |
| 2013/0338950 | A1* | 12/2013 | Joe ........................ H02J 7/007 702/63 |
| 2014/0065450 | A1 | 3/2014 | Senoue et al. |
| 2014/0222358 | A1 | 8/2014 | Morita et al. |
| 2014/0225570 | A1* | 8/2014 | Suga ..................... H01M 10/42 320/134 |

FOREIGN PATENT DOCUMENTS

| | | |
|---|---|---|
| CN | 102084261 A | 6/2011 |
| CN | 102983371 A | 3/2013 |
| EP | 2 530 482 A2 | 12/2012 |
| JP | 7-37623 A | 2/1995 |
| JP | 2005-12960 | 1/2005 |
| JP | 2008-241246 A | 10/2008 |
| JP | 2009-228939 | 10/2009 |
| JP | 2010-60406 A | 3/2010 |
| JP | 2011-075461 | 4/2011 |
| JP | 2011-122965 | 6/2011 |
| JP | 2012-115004 A | 6/2012 |
| JP | 2012-141202 | 7/2012 |
| JP | 2012-198175 A | 10/2012 |
| JP | 2012-251806 | 12/2012 |
| JP | 2012251806 | * 12/2012 |
| JP | 2014-53134 | 3/2014 |
| JP | 2014-055503 | 3/2014 |
| JP | 2014-190763 | 10/2014 |
| KR | 10-2013-0126273 | 11/2013 |
| TW | 535308 | 6/2003 |
| TW | 1331417 | 10/2010 |
| TW | 201314236 | 4/2013 |

OTHER PUBLICATIONS

Notice of Preliminary Rejection issued by Korean Intellectual Property Office dated Nov. 20, 2015 for Patent Application No. KR 10-2014-0171981.
First Office Action issued by the State Intellectual Property Office of the People's Republic of China dated Mar. 31, 2017, for corresponding Chinese Application No. 201410730052.4, 9 pages.

* cited by examiner

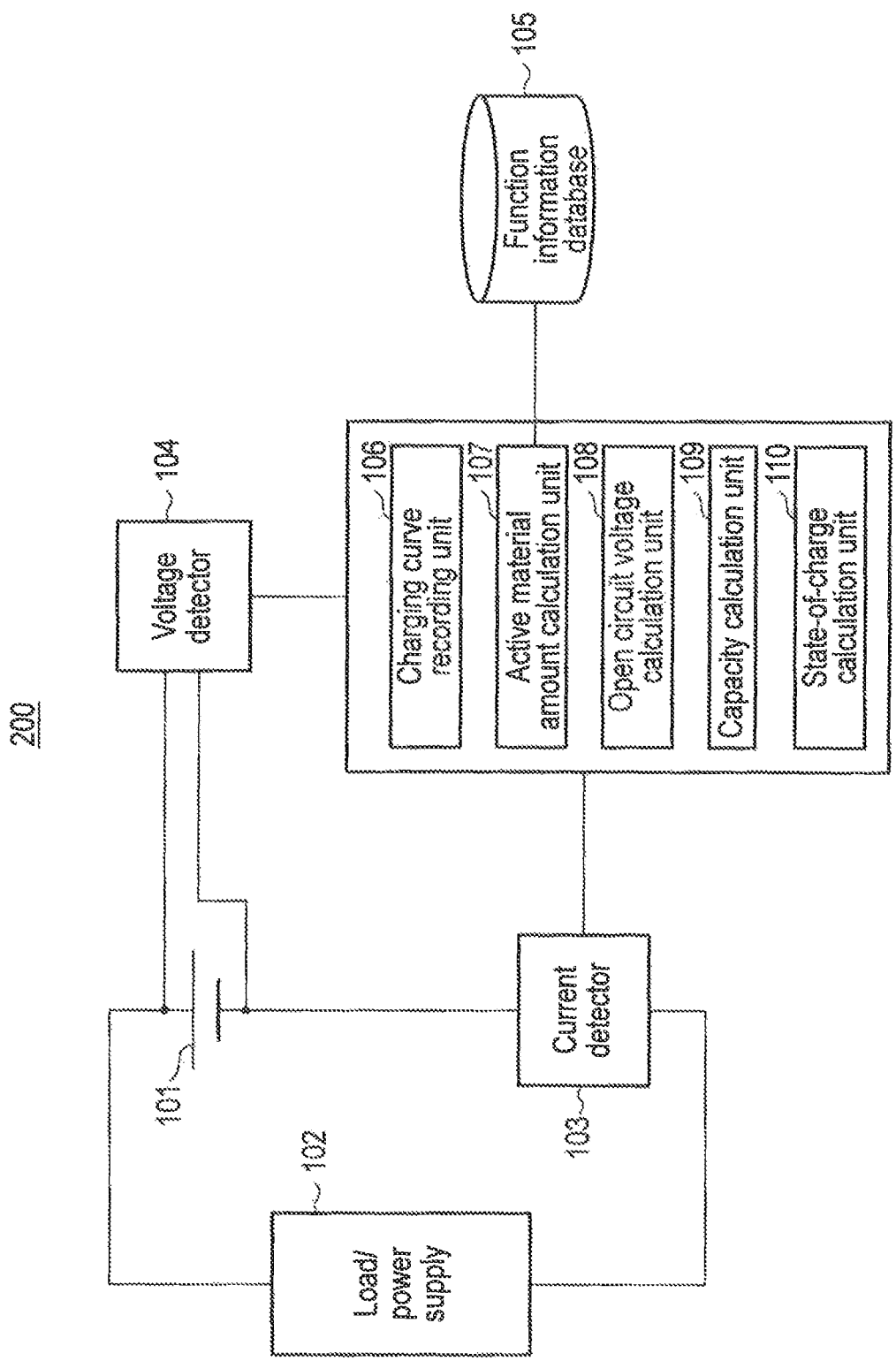
F I G. 9

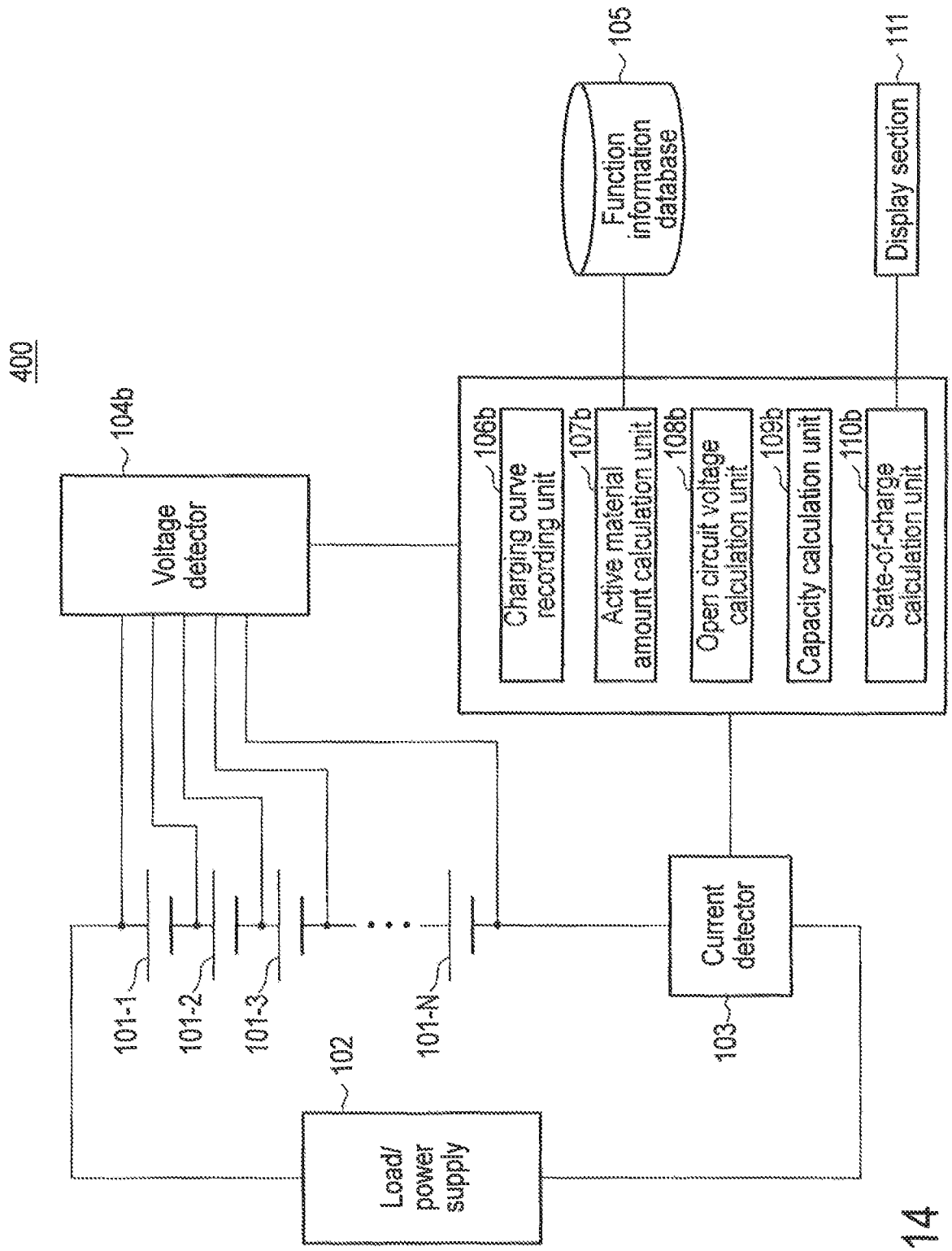
F I G. 14

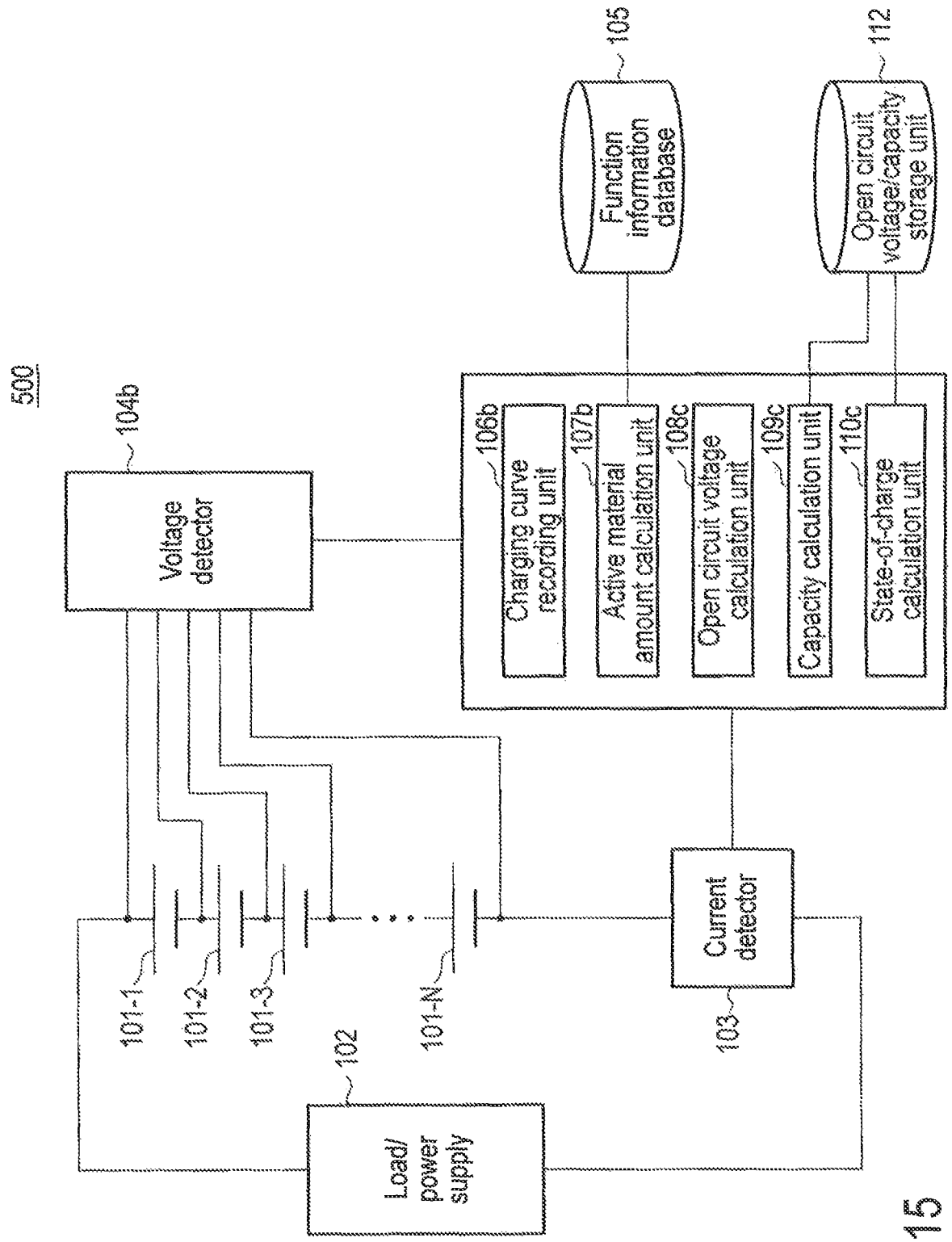
F I G. 15

CELL CALCULATION APPARATUS AND METHOD FOR CALCULATING AN OPEN-CIRCUIT VOLTAGE OF A CELL

CROSS-REFERENCE TO RELATED APPLICATIONS

This application is based upon and claims the benefit of priority from Japanese Patent Application No. 2013-253555, filed Dec. 6, 2013, the entire contents of which are incorporated herein by reference.

FIELD

Embodiments described herein relate generally to a cell state calculation apparatus and a cell state calculation method.

BACKGROUND

When being subjected to overcharge or over-discharge, a secondary cell deteriorates in performance. Accordingly, in order to use a secondary cell in a state where the secondary cell can be used safely, and deterioration of the secondary cell is hardly caused, it is important to accurately grasp a relationship between a charged capacity and an open circuit voltage. However, it is known that a relationship between a charged capacity and an open circuit voltage changes with use (see, for example, JP-A 2012-141202 (KOKAI)).

As a method of accurately estimating an open circuit voltage on a long-term basis, JP-A 2012-141202 (KOKAI) discloses a method of obtaining a charged capacity and an open circuit voltage at a second time point, by using a relationship between a charged capacity and a potential of a cathode of a battery cell measured at a first time point, a relationship between a charged capacity and a potential of an anode of the battery cell measured at the first time point, and an increment in alternating-current impedance within a period from the first time point to the second time point.

However, in the technique of JP-A 2012-141202 (KOKAI), in order to grasp a relationship between a charged capacity and an open circuit voltage at a certain time point, it is necessary to apply an alternating current to the cell, and carry out impedance measurement. However, such charge/discharge is not carried out when the cell is normally used, and hence in order to grasp the relationship between a charged capacity and an open circuit voltage, it is necessary to carry out specific charge/discharge.

BRIEF DESCRIPTION OF THE DRAWINGS

FIG. 9 is a block diagram showing the configuration of a cell state calculation apparatus according to a second embodiment.

FIG. 14 is a block diagram showing the configuration of a cell state calculation apparatus according to a fourth embodiment.

FIG. 15 is a block diagram showing the configuration of a cell state calculation apparatus according to a fifth embodiment.

DETAILED DESCRIPTION

In general, according to an embodiment, a cell state calculation apparatus includes a voltage detector, a current detector, a database, an active material amount calculation unit, and an open circuit voltage calculation unit. The voltage detector is configured to detect a terminal voltage of a secondary cell. The current detector is configured to detect a current flowing through the secondary cell. The database is configured to store a function indicating a relationship between a voltage and a charged capacity of an active material. The active material amount calculation unit is configured to calculate an amount of an active material of the secondary cell by referring to the database and by using the voltage detected by the voltage detector and the current detected by the current detector while the secondary cell is charged or discharged. The open circuit voltage calculation unit is configured to calculate a function indicating a relationship between an open circuit voltage and a charged capacity of the secondary cell by referring to the database and by using the amount of the active material calculated by the active material amount calculation unit.

Hereinafter, cell state calculation apparatuses and cell state calculation methods according to the embodiments will be described in detail with reference to the accompanying drawings.

First Embodiment

In a first embodiment, an amount of an active material of a cathode and an amount of an active material of an anode are estimated from current/voltage curves at the charge time or at the discharge time, and an open circuit voltage of a secondary cell is estimated from the amounts of the active materials of the electrodes (i.e., the cathode and the anode).

Figure 1:
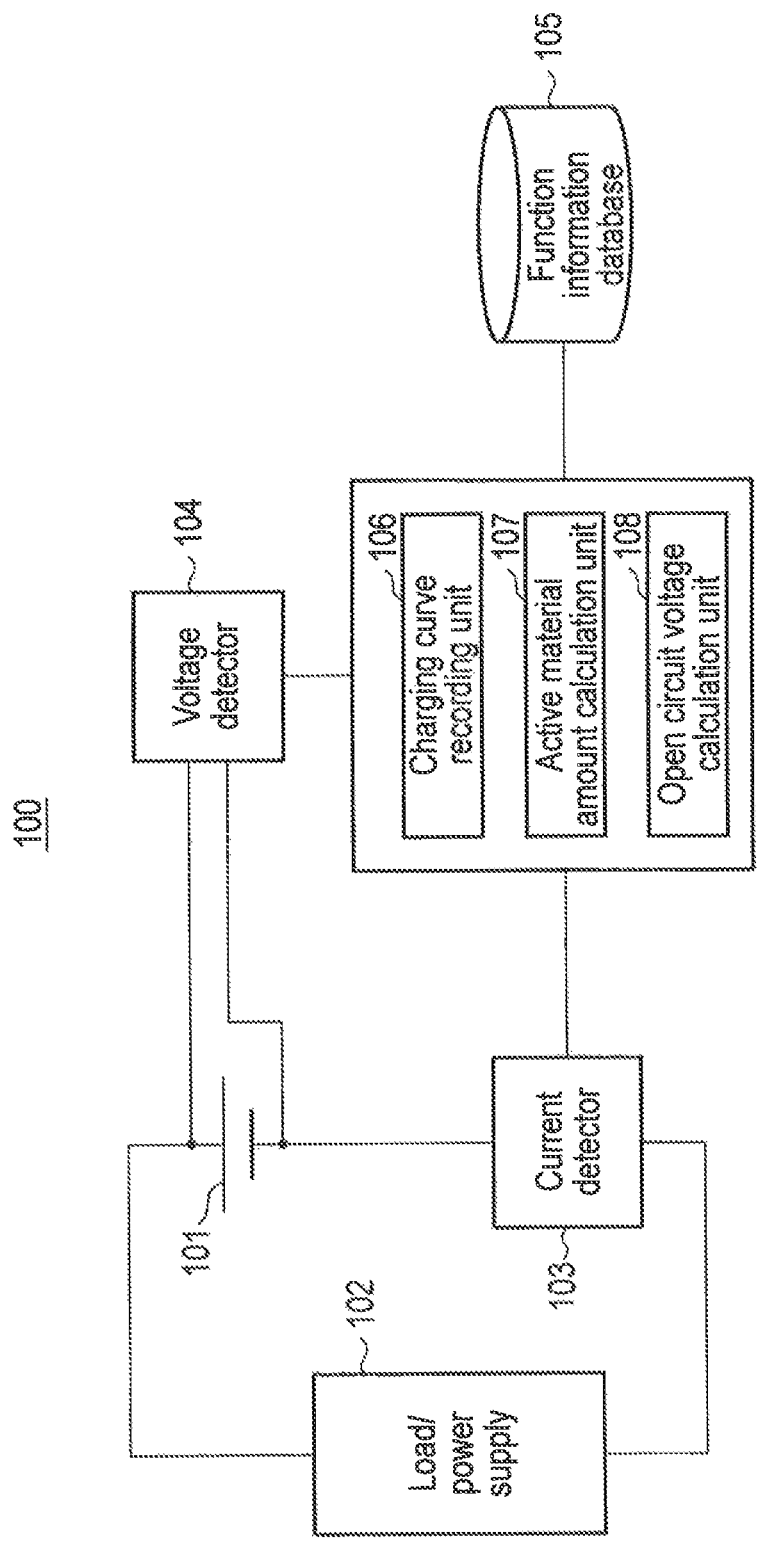
FIG. 1 is a block diagram showing the configuration of a cell state calculation apparatus according to a first embodiment.

FIG. 1 is a view showing the configuration of a cell state calculation apparatus according to the first embodiment. A cell state calculation apparatus 100 shown in FIG. 1 includes a secondary cell 101, a load or power supply 102, a current detector 103, a voltage detector 104, a function information database 105, a charging curve recording unit 106, an active material amount calculation unit 107, and an open circuit voltage calculation unit 108.

The secondary cell 101 is a secondary cell such as a lithium-ion cell or the like.

The load or the power supply 102 is connected to the secondary cell 101, and is a load consuming the power of the secondary cell 101 or is a power supply supplying power to the secondary cell 101.

The current detector 103 detects a current flowing through the secondary cell 101.

The voltage detector 104 detects a voltage between a cathode terminal and an anode terminal of the secondary cell 101.

Figure 2:
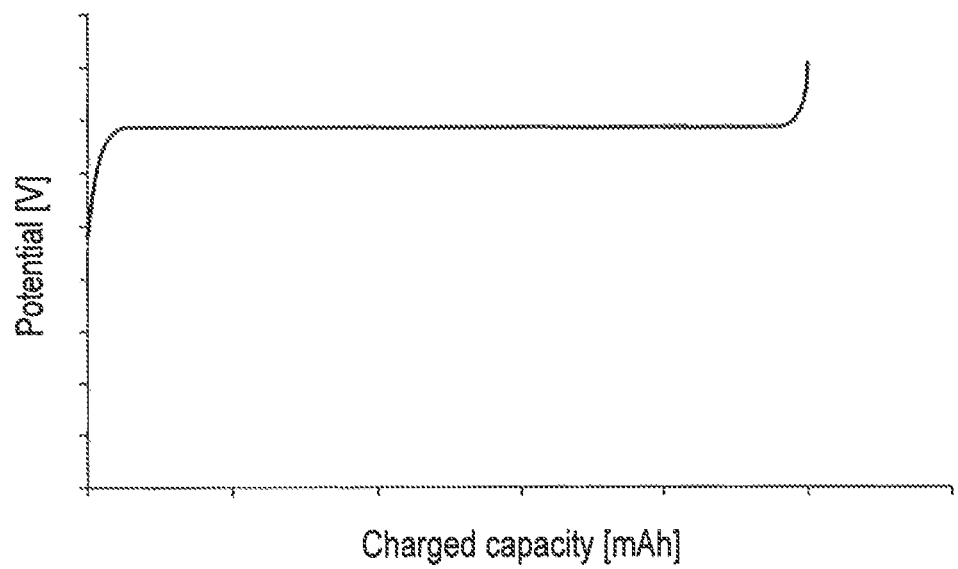
FIG. 2 is a view showing a function indicating a relationship between a potential and a charged capacity of a cathode active material.
Figure 3:
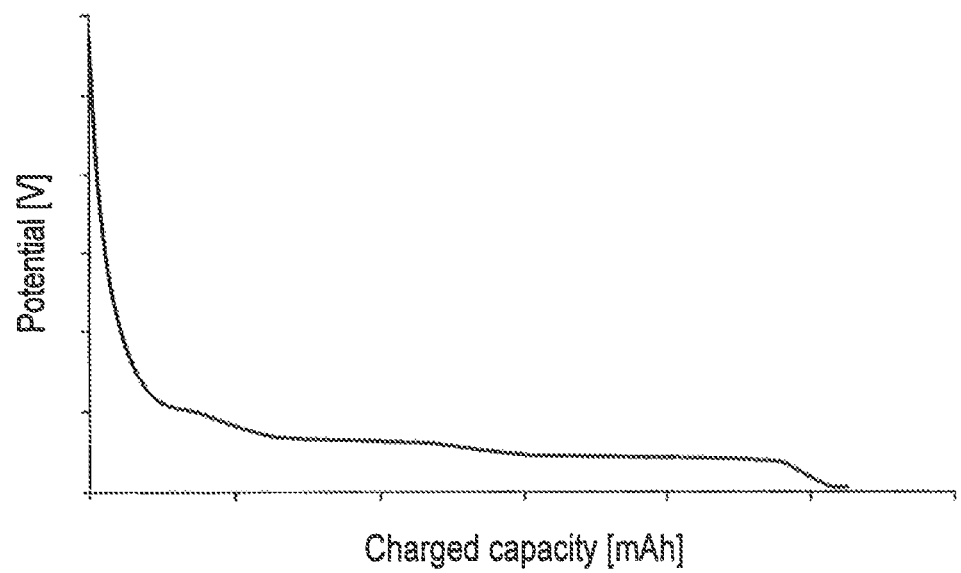
FIG. 3 is a view showing a function indicating a relationship between a potential and a charged capacity of an anode active material.

In the function information database 105, a function indicating a relationship between a potential and a charged capacity of an active material forming each of the electrodes which form the secondary cell 101 is recorded. FIG. 2 shows an example of a function indicating a relationship between a potential and a charged capacity of a cathode active material. FIG. 3 shows an example of a function indicating a relationship between a potential and a charged capacity of an anode active material.

The charging curve recording unit 106, the active material amount calculation unit 107, and the open circuit voltage calculation unit 108 are implemented by a dedicated integrated circuit or a combination of an arithmetic device such as a CPU, an MCU or the like, and storage device such as a RAM, a ROM or the like.

The charging curve recording unit 106 records a current detected by the current detector 103 and a voltage detected by the voltage detector 104 while the secondary cell 101 is charged or discharged.

Figure 4:
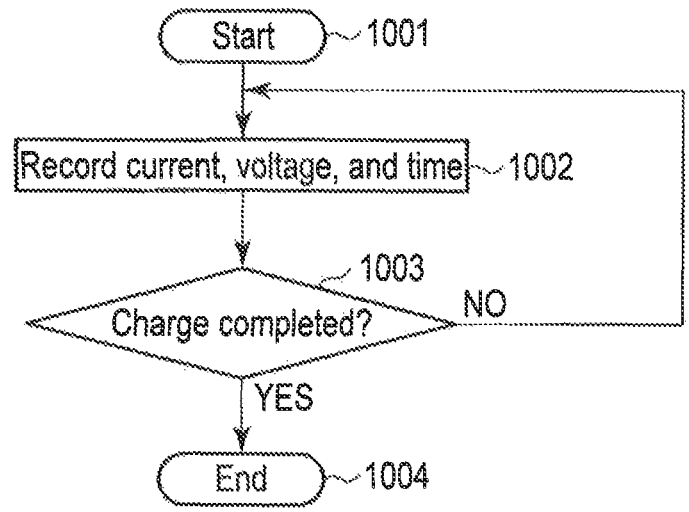
FIG. 4 is a flowchart showing processing of a charging curve recording unit.

FIG. 4 shows a flow of processing of the charging curve recording unit 106. When charge of the secondary cell 101 is started, the charging curve recording unit 106 starts processing from step 1001, and repetitively executes processing of step 1002 shown in FIG. 4 at certain time intervals. Although it is possible to arbitrarily set the time interval, it is desirable that the time interval be set to, for example, about 0.1 seconds to 1 second.

The charging curve recording unit 106 starts processing from step 1001, and records a current, a voltage, and time in step 1002. Here, the time may be one of the absolute time and the relative time from the start of the charge. Further, when the processing of the charging curve recording unit 106 is repeated at certain time intervals, recording of the time can be omitted. When the charge of the secondary cell 101 is completed in step 1003, the processing is terminated in step 1004.

Figure 5:
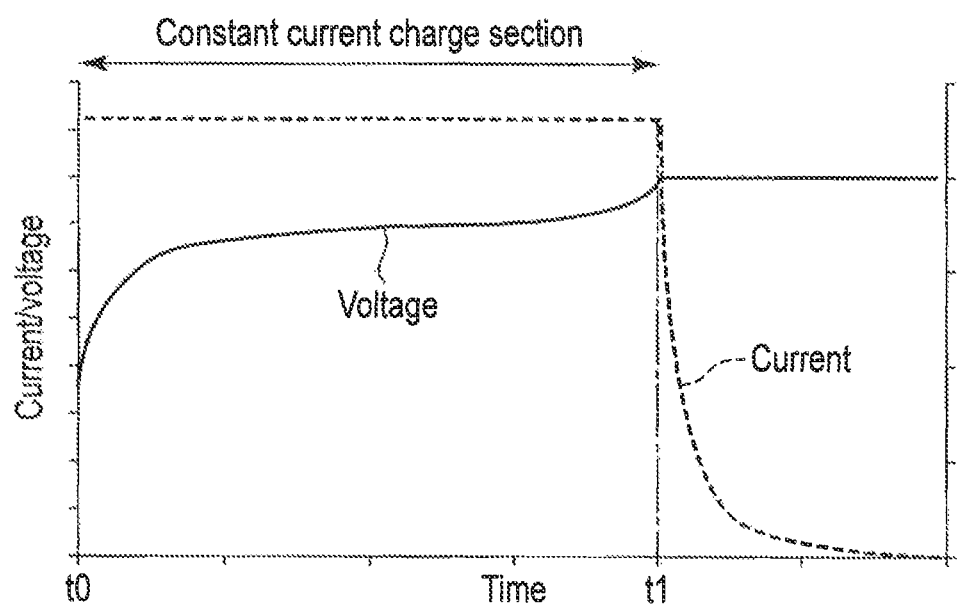
FIG. 5 is a view showing an example of current/voltage curves at the charge time.

FIG. 5 shows an example of current/voltage curves at the charge time. In FIG. 5, a curve indicated by a broken line is a current curve, and a curve indicated by a solid line is a voltage curve. The charging curve shown in FIG. 5 is an example of constant current and constant voltage (CCCV) charge generally used as a charging method of a secondary cell.

In the processing of the active material amount calculation unit 107 shown in the present embodiment, it is possible to use, for example, the charging curve of the entire CCCV charge or only the charging curve of a constant current (CC) charge section (a part from t0 to t1 of FIG. 5).

The active material amount calculation unit 107 calculates an amount of the active material forming the cathode of the secondary cell 101, an amount of the active material forming the anode of the secondary cell 101, an initial charged capacity of the active material forming the cathode, an initial charged capacity of the active material forming the anode, and an internal resistance of the secondary cell 101 from the charging curve recorded by the charging curve recording unit 106 by using the method shown in JP-A 2012-251806 (KOKAI) or the like. More specifically, a function of calculating a cell voltage from amounts of the active materials and an internal resistance is utilized, and amounts of the active materials and an internal resistance which make a difference between a cell voltage calculated by utilizing the function and current/voltage data at the charge time or at the discharge time of the cell small are obtained by regression calculation. It should be noted that in JP-A 2012-251806 (KOKAI), although an example of a case where the cathode is formed of a plurality of active materials is described, in the present embodiment, a description will be given by taking a secondary cell in which each of the cathode and the anode is formed of one kind of an active material as an example.

When the secondary cell in which each of the cathode and the anode is formed of one kind of an active material is charged, a terminal voltage $V_t$ at time t can be expressed by formula 1.

$$V_t = f_c\left(q_0^c + \frac{q_t}{M_c}\right) - f_a\left(q_0^a + \frac{q_t}{M_a}\right) + RI_t \qquad \text{(formula 1)}$$

$I_t$ . . . current value at time t
$q_t$ charged capacity of the cell at time t
$f_c$ function indicating a relationship between a potential and a charged capacity of the cathode
$f_a$ . . . function indicating a relationship between a potential and a charged capacity of the anode
$q_0^c$ . . . initial charged capacity of the cathode
$M_c$ . . . mass of the cathode
$q_0^a$ . . . initial charged capacity of the anode
$M_a$ mass of the anode
R . . . internal resistance Here, the current value at time t is a detection value of the current detector 103 recorded in the charging curve recording unit 106, and the charged capacity of the cell at time t can be calculated by time-integrating the current value. The function indicating a relationship between a potential and a charged capacity of the cathode (FIG. 2), and the function indicating a relationship between a potential and a charged capacity of the anode (FIG. 3) are recorded in the function information database 105. The active material amount calculation unit 107 estimates five values (parameter set) including the initial charged capacity of the cathode, the mass of the cathode, the initial charged capacity of the anode, the mass of the anode, and the internal resistance by regression calculation as shown below.

Figure 6:
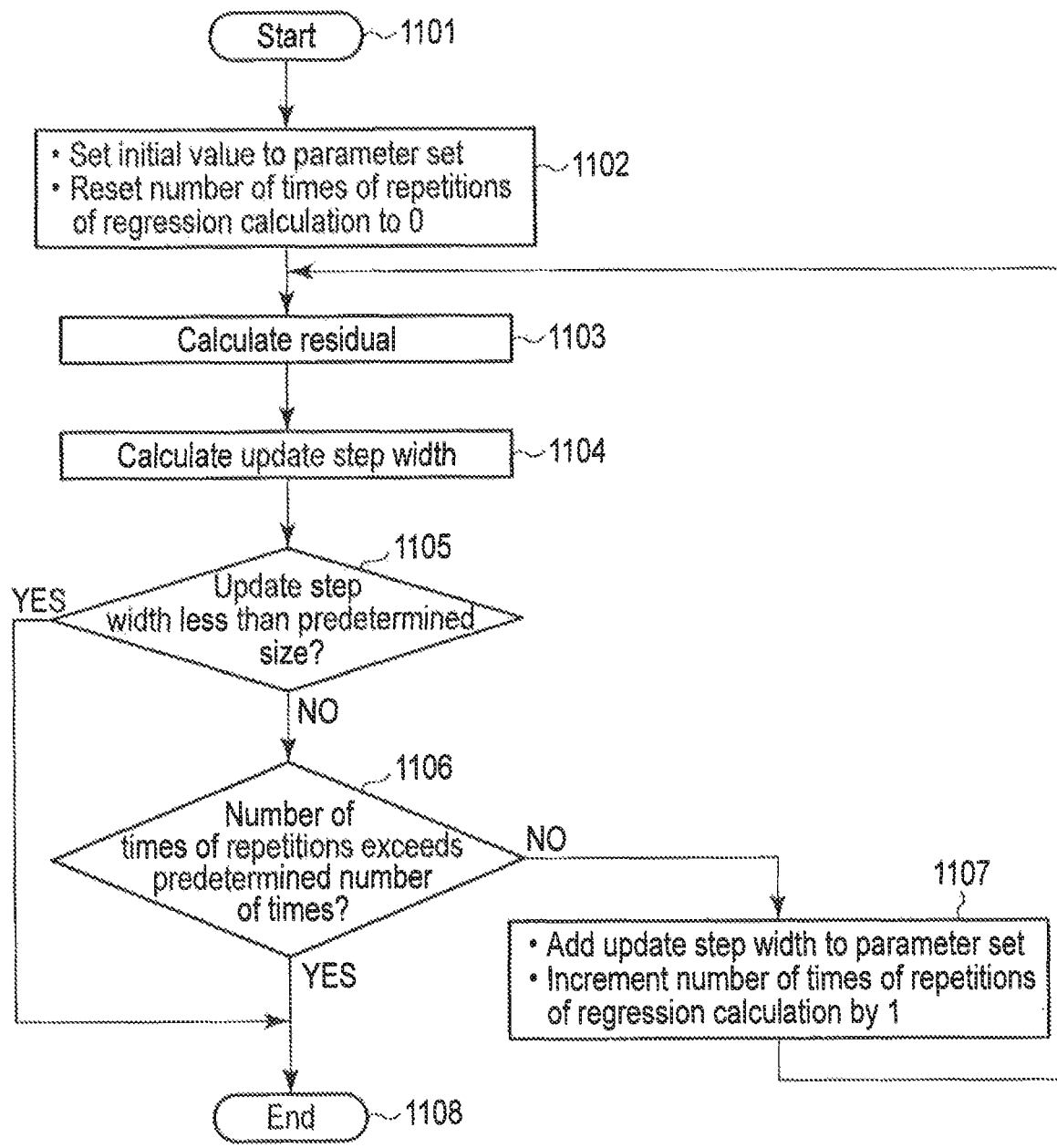
FIG. 6 is a flowchart showing processing of an active material amount calculation unit.

FIG. 6 is a flowchart showing a flow of processing of the active material amount calculation unit 107. After the charge of the secondary cell 101 is completed, the active material amount calculation unit 107 starts execution from step 1101.

In step 1102, the active material amount calculation unit 107 sets initial values to the parameter set, and resets the number of times of repetitions of regression calculation to 0. It should be noted that the parameter set implies the five values estimated by regression calculation. As the initial values, for example, values calculated when the most recent active material amount calculation processing has been carried out are used.

In step 1103, the active material amount calculation unit 107 calculates a residual expressed by formula 2.

$$E = \sum_{i=0}^{t_{end}} \left( V_{bat\_t} - \left( f_c\left(q_0^c + \frac{q_t}{M_c}\right) - f_a\left(q_0^a + \frac{q_t}{M_a}\right) + RI_t \right) \right)^2 \quad \text{(formula 2)}$$

$V_{bat\_t}$ ... terminal voltage at time t
$t_{end}$ ... charge ending time

In step 1104, the active material amount calculation unit 107 calculates update step widths of the parameter set. The update step widths of the parameter set can be calculated by using, for example, the Gauss-Newton method or Levenberg-Marquardt method.

In step 1105, the active material amount calculation unit 107 determines whether or not sizes of the update step widths are less than predetermined sizes.

When the sizes of the update step widths are greater than or equal to the predetermined values in the determination of step 1105, it is confirmed in step 1106 whether or not the number of times of repetitions of the regression calculation exceeds a predetermined value. When the number of times of repetitions of the regression calculation exceeds the predetermined value, the current parameter set is made an output, and the calculation is terminated in step 1108.

When the number of times of repetitions of the regression calculation is less than or equal to the predetermined number of times in the determination of step 1106, the processing is advanced to step 1107. In step 1107, the update step widths calculated in step 1104 are added to the parameter set, the number of times of repetitions of the regression calculation is incremented by 1, and the processing is advanced to step 1103 again.

When the sizes of the update step widths are less than the predetermined values in step 1105, the active material amount calculation unit 107 determines that the calculation has converged, makes the current parameter set an output, and terminates the calculation in step 1108.

In the present embodiment, although the charging curve has been used as an input to the active material amount calculation unit, it is also possible to calculate the amounts of the active materials by using a discharging curve. It should be noted that even when the discharging curve is used, as the flow of processing of the active material amount calculation unit 107, and contents of the function information database 105, the flow, and contents identical to the case where the amounts of the active materials are calculated by using the charging curve can be used.

The open circuit voltage calculation unit 108 utilizes the mass of the cathode, the mass of the anode, the initial charged capacity of the cathode, and the initial charged capacity of the anode which are calculated by the active material amount calculation unit 107 to calculate a relationship between the open circuit voltage and the charged capacity of the cell.

Figure 7:
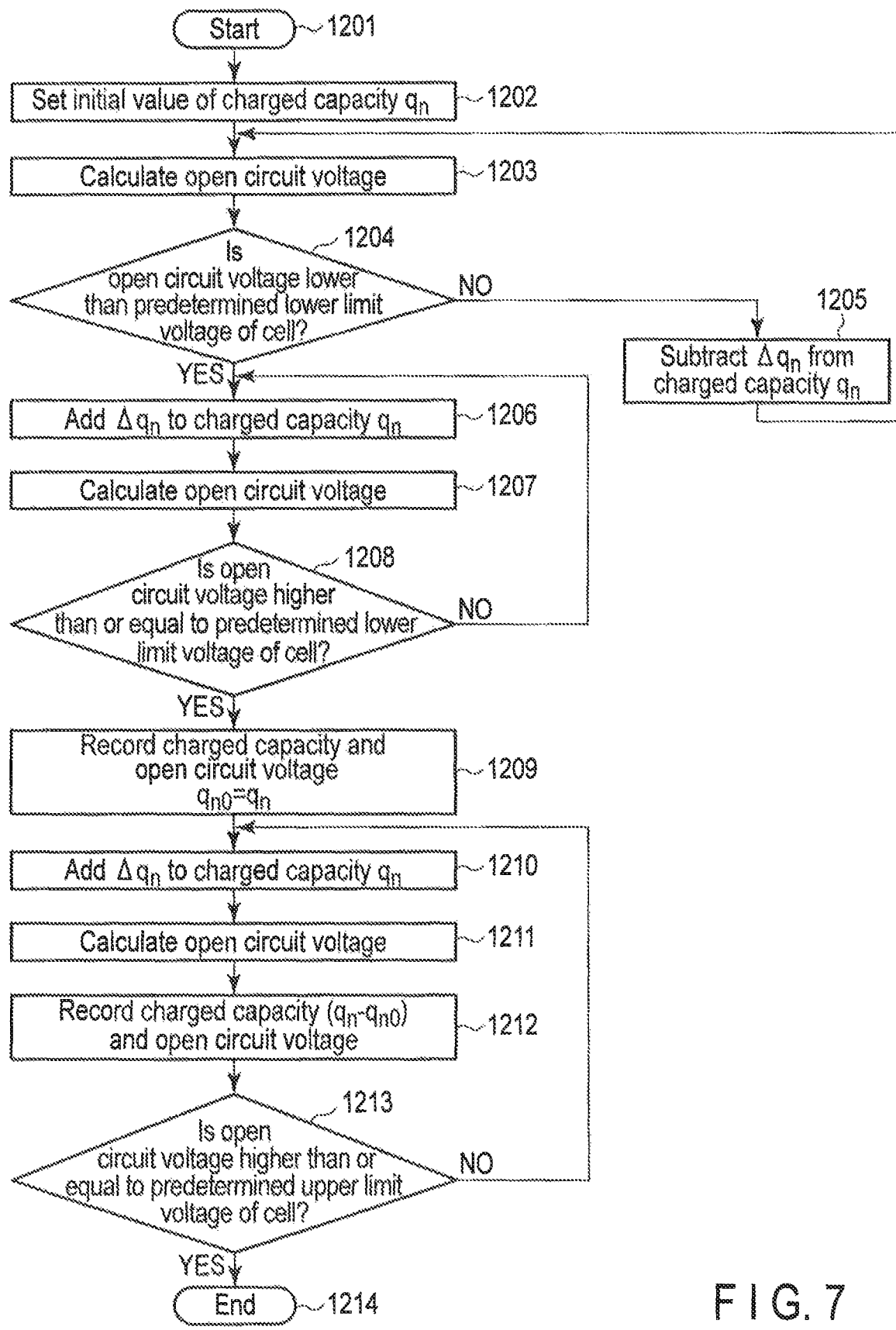
FIG. 7 is a flowchart showing processing of an open circuit voltage calculation unit.

FIG. 7 shows a flow of processing of the open circuit voltage calculation unit 108. After the active material amount calculation unit 107 has completed the processing thereof, the open circuit voltage calculation unit 108 starts processing from step 1201.

In step 1202, the open circuit voltage calculation unit 108 sets an initial value of a charged capacity $q_n$. Although the initial value of $q_n$ can be set to an arbitrary value, it is desirable that the initial value be set to 0 or a value smaller than 0 by about several percent of the nominal capacity of the secondary cell 101. More specifically, it is desirable, when the nominal capacity of the secondary cell 101 is 1000 mAh, that the initial value is set to a value within a range from about −50 mAh to 0 mAh.

In step 1203, the open circuit voltage calculation unit 108 calculates an open circuit voltage. Formula 3 can be used for calculation of the open circuit voltage.

$$E_n = f_c\left(q_0^c + \frac{q_n}{M_c}\right) - f_a\left(q_0^a + \frac{q_n}{M_a}\right) \quad \text{(formula 3)}$$

Next, in step 1204, the open circuit voltage calculation unit 108 compares the open circuit voltage calculated in step 1203 with a predetermined lower limit voltage of the cell. The lower limit voltage of the cell is a value to be determined by a combination of a cathode active material and an anode active material used for the secondary cell 101. More specifically, a voltage within a range of use appropriate in terms of safety, life, resistance, and the like is determined for each of the cathode active material and the anode active material, and a lower limit voltage and an upper limit voltage of the range of use of the cell are determined by a combination of the voltages. When the open circuit voltage is lower than the predetermined lower limit voltage, the processing is advanced to step 1206, and when the open circuit voltage is higher than or equal to the lower limit voltage, the processing is advanced to step 1205.

In step 1205, $\Delta q_n$ is subtracted from the charged capacity $q_n$. Here, although $\Delta q_n$ can be set to an arbitrary value, it is desirable that $\Delta q_n$ be set to a value of about $\frac{1}{1000}$ to $\frac{1}{100}$ of the nominal capacity of the secondary cell 101. More specifically, it is desirable, when the nominal capacity of the secondary cell 101 is 1000 mAh, that $\Delta q_n$ be set to a value within a range from about 1 mAh to 10 mAh.

In step 1206, the open circuit voltage calculation unit 108 adds $\Delta q_n$ to the charged capacity $q_n$, then advances to step 1207, and calculates the open circuit voltage by using above formula 3. Further, in step 1208, the open circuit voltage calculation unit 108 compares the open circuit voltage calculated in step 1207 with the predetermined lower limit voltage of the cell. When the open circuit voltage is lower than the predetermined lower limit voltage, the processing is returned to step 1206, and when the open circuit voltage is higher than or equal to the lower limit voltage, the processing is advanced to step 1209.

When the processing is advanced to step 1209, $q_n$, which makes the open circuit voltage slightly exceed the predetermined lower limit voltage, can be obtained. In step 1209, the open circuit voltage calculation unit 108 records the charged capacity as a value of 0, and records the open circuit voltage $E_t$ calculated in step 1207 together with the charged capacity. Further, the charged capacity $q_n$ at this time is made $q_{n0}$.

In step 1210, the open circuit voltage calculation unit 108 adds $\Delta q_n$ to the charged capacity $q_n$, calculates the open circuit voltage in step 1211 by using above formula 3, and then advances to step 1212.

In step 1212, the open circuit voltage calculation unit 108 records a value obtained by subtracting $q_{n0}$ from the charged capacity $q_n$, and the open circuit voltage $E_t$ calculated in step 1211, and then advances to step 1213.

In step 1213, the open circuit voltage calculation unit 108 compares the open circuit voltage calculated in step 1211 with a predetermined upper limit voltage of the cell. The upper limit voltage of the cell is a value to be determined by a combination of a cathode material and an anode material used for the secondary cell 101. When the open circuit voltage is lower than the predetermined upper limit voltage, the open circuit voltage calculation unit 108 advances to step 1210, and when the open circuit voltage is higher than or equal to the predetermined upper limit voltage in step 1213, the open circuit voltage calculation unit 108 terminates the processing in step 1214.

Figure 8A:
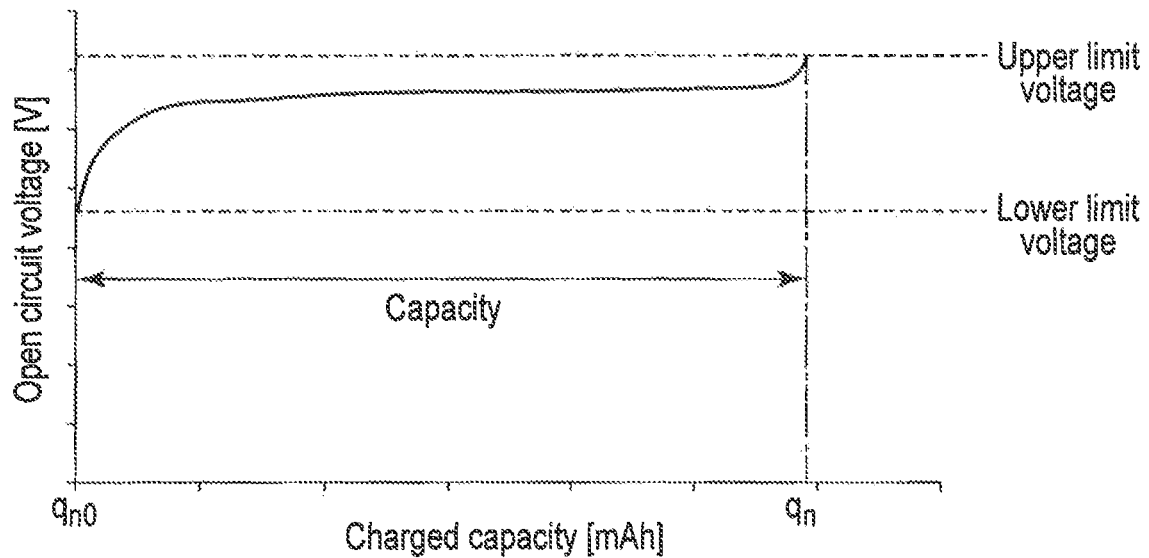
FIG. 8A is a view showing an example of a function indicating a relationship between a charged capacity and an open circuit voltage calculated by the open circuit voltage calculation unit.
Figure 8B:
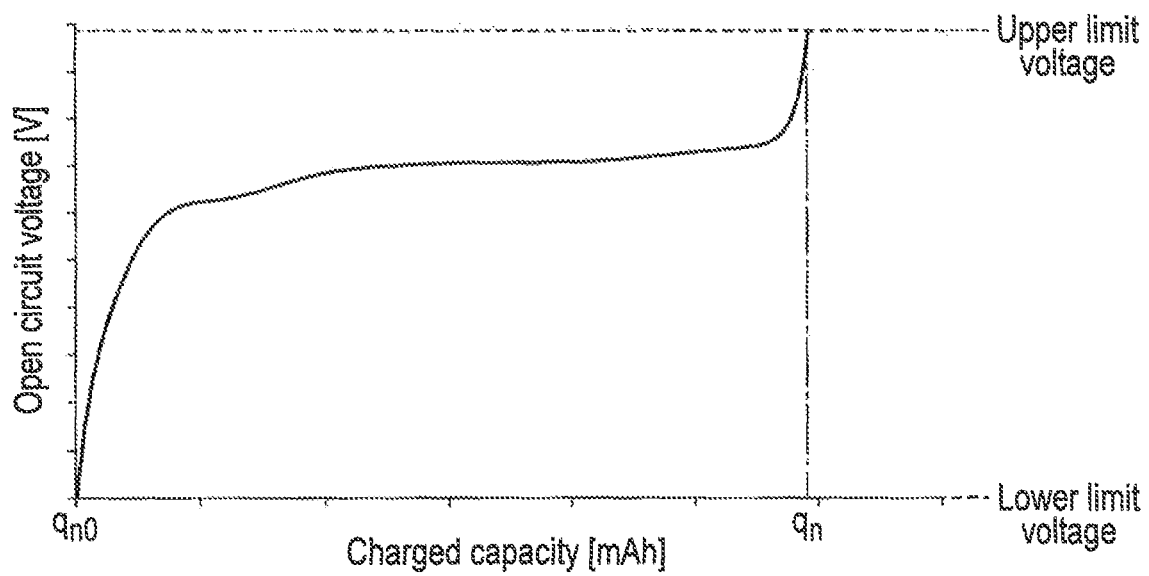
FIG. 8B is a view obtained by enlarging the vertical axis of the function shown in FIG. 8A.
Figure 8C:
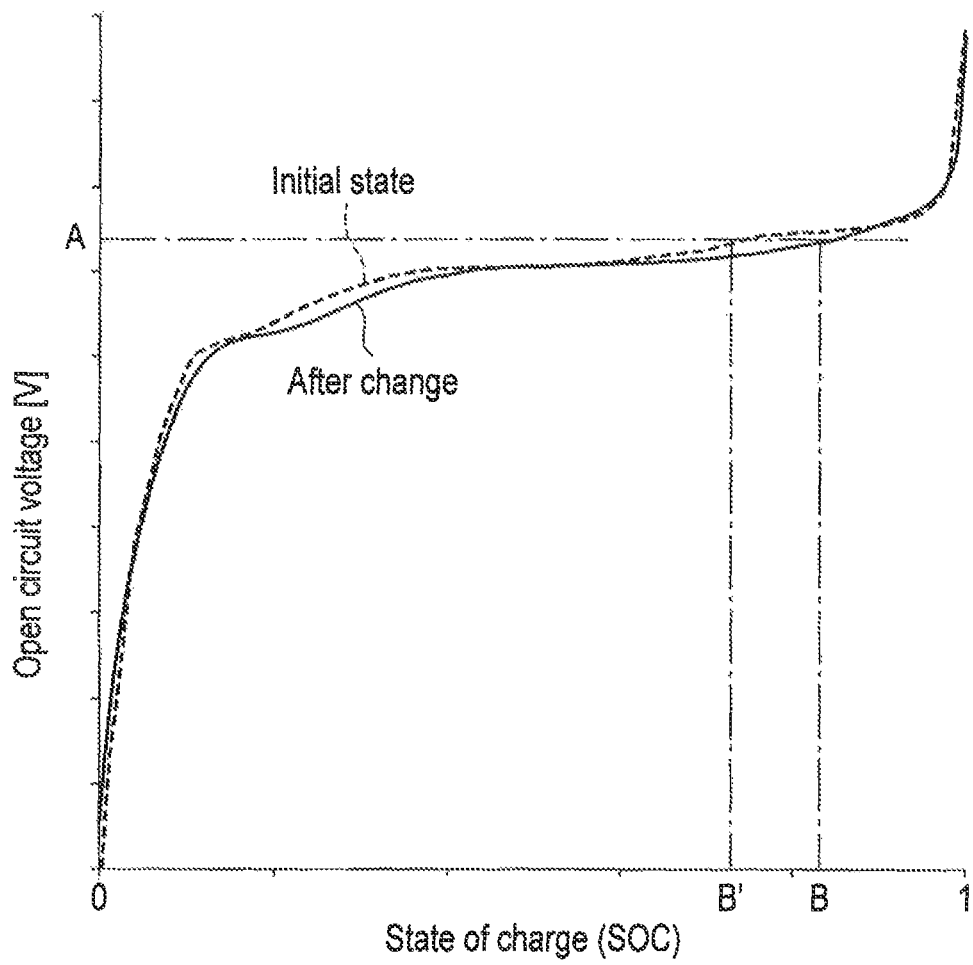
FIG. 8C is a view showing the function shown in FIG. 8B and a curve of an open circuit voltage of a cell in an initial state in an overlaying manner.

FIG. 8A shows an example of a function indicating a relationship between the charged capacity and the open circuit voltage calculated by the open circuit voltage calculation unit 108. In FIG. 8B, a view obtained by enlarging the vertical axis of the function shown in FIG. 8A is shown. FIG. 8C is a view showing the function shown in FIG. 8B, and a curve of an open circuit voltage of a cell in an initial state in an overlaying manner. The broken line in FIG. 8C indicates a curve of the open circuit voltage of the cell in the initial state, and the solid line indicates a curve of the open circuit voltage of the cell after a change caused by deterioration or the like of the cell. Here, the transverse axis of FIG. 8C indicates, in place of the charged capacity, a state of charge (SOC) denoting a percentage of the electric-charge amount given to the cell in comparison with the full-charge capacity on a scale of 0 to 1. It should be noted that the SOC, the charged capacity, and the like are included in the state of charge.

Regarding the curve after the change, the length of the curve becomes shorter with reduction in capacity. According to FIG. 8C, it can be seen that not only the length of the curve, but also the shape itself of the curve has changed. For example, when the state of charge (SOC) is to be estimated from the voltage based on the open circuit voltage, if the measured voltage is A, the correct state of charge becomes B. However, when it is assumed that the curve of the open circuit voltage does not change in shape, the state of charge obtained from the voltage A becomes B', and the estimate accuracy of the state of charge is lowered. Generally, in the measurement of the state of charge, an initial value of the state of charge is obtained by referring to the open circuit voltage, and hence it is possible to measure the state of charge with a high degree of accuracy by utilizing the open circuit voltage calculated in the manner as shown in the first embodiment.

Therefore, according to the first embodiment, it is possible to accurately grasp a relationship between the charged capacity and the open circuit voltage without carrying out specific charge/discharge or the like, the relationship changing with use, and estimate the state of charge with a high degree of accuracy.

In this first embodiment, although a case where each of the cathode and the anode of the secondary cell is formed of one kind of active material has been described, the description is also applicable to a secondary cell in which one of the cathode and the anode of the secondary cell is formed of two or more kinds of active materials. Further, when a database storing therein amounts of active materials of the secondary cell 101 are prepared in advance, the open circuit voltage calculation unit 108 can calculate the function indicating a relationship between the open circuit voltage and the charged capacity of the secondary cell within a predetermined voltage range of the cell by using the amounts of the active materials stored in the database.

Second Embodiment

The state of charge (SOC) is an indicator expressing a percentage of the electric-charge amount currently held by the cell in comparison with the full-charge capacity of the cell. Accordingly, in order to accurately obtain the state of charge, it is necessary to accurately grasp the full charge capacity. Thus, in a second embodiment, the capacity and the state of charge of the cell are calculated by using the relationship between the open circuit voltage and the charged capacity calculated in the first embodiment.

FIG. 9 is a view showing the configuration of a cell state calculation apparatus according to the second embodiment. A cell state calculation apparatus 200 shown in FIG. 9 includes a secondary cell 101, a load or power supply 102, a current detector 103, a voltage detector 104, a function information database 105, a charging curve recording unit 106, an active material amount calculation unit 107, an open circuit voltage calculation unit 108, a capacity calculation unit 109, and a state-of-charge calculation unit 110. It should be noted that in the cell state calculation apparatus 200, components denoted by using the reference numerals identical to those in FIG. 1 shown in the first embodiment are identical to the first embodiment, and hence a detailed description of them are omitted here.

Hereinafter, a description will be given with a focus on the capacity calculation unit 109 and the state-of-charge calculation unit 110 which differ from the first embodiment.

The capacity calculation unit 109 calculates the capacity of the secondary cell 101 by comparing, based on a function indicating a relationship between an open circuit voltage and a charged capacity calculated by the open circuit voltage calculation unit 108, an open circuit voltage indicated by the function, and predetermined voltage range (a lower limit voltage and an upper limit voltage) of the cell with each other.

Figure 10:
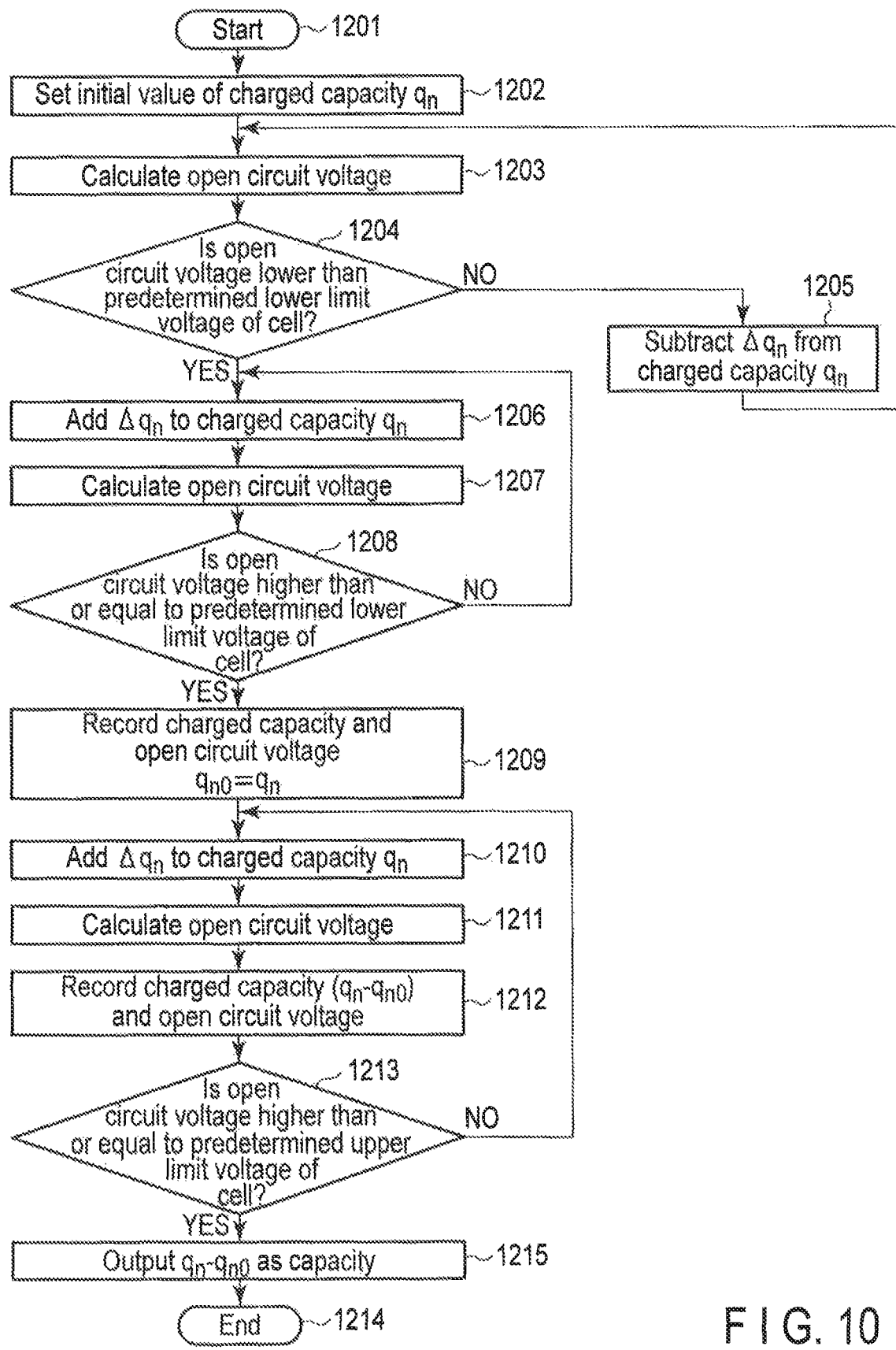
FIG. 10 is a flowchart showing processing of an open circuit voltage calculation unit, and a capacity calculation unit according to the second embodiment.

FIG. 10 is a flowchart showing a flow of processing of the open circuit voltage calculation unit 108 and the capacity calculation unit 109, and is a flowchart obtained by adding processing step 1215 of the capacity calculation unit 109 to the processing of the open circuit voltage calculation unit 108 shown in the above first embodiment. In step 1215, the capacity calculation unit 109 calculates the capacity (full-charge capacity) of the cell by calculating a difference $q_n - q_{n0}$ between a charged capacity $q_n$ of a point at which the open circuit voltage exceeds the predetermined upper limit voltage of the cell, and charged capacity $q_{n0}$ of a point at which the open circuit voltage exceeds the predetermined lower limit voltage of the cell.

The state-of-charge calculation unit 110 calculates the state of charge of the secondary cell 101 by using the relationship between the open circuit voltage and the charged capacity calculated by the open circuit voltage calculation unit 108, and the capacity of the cell calculated by the capacity calculation unit 109.

Figure 11:
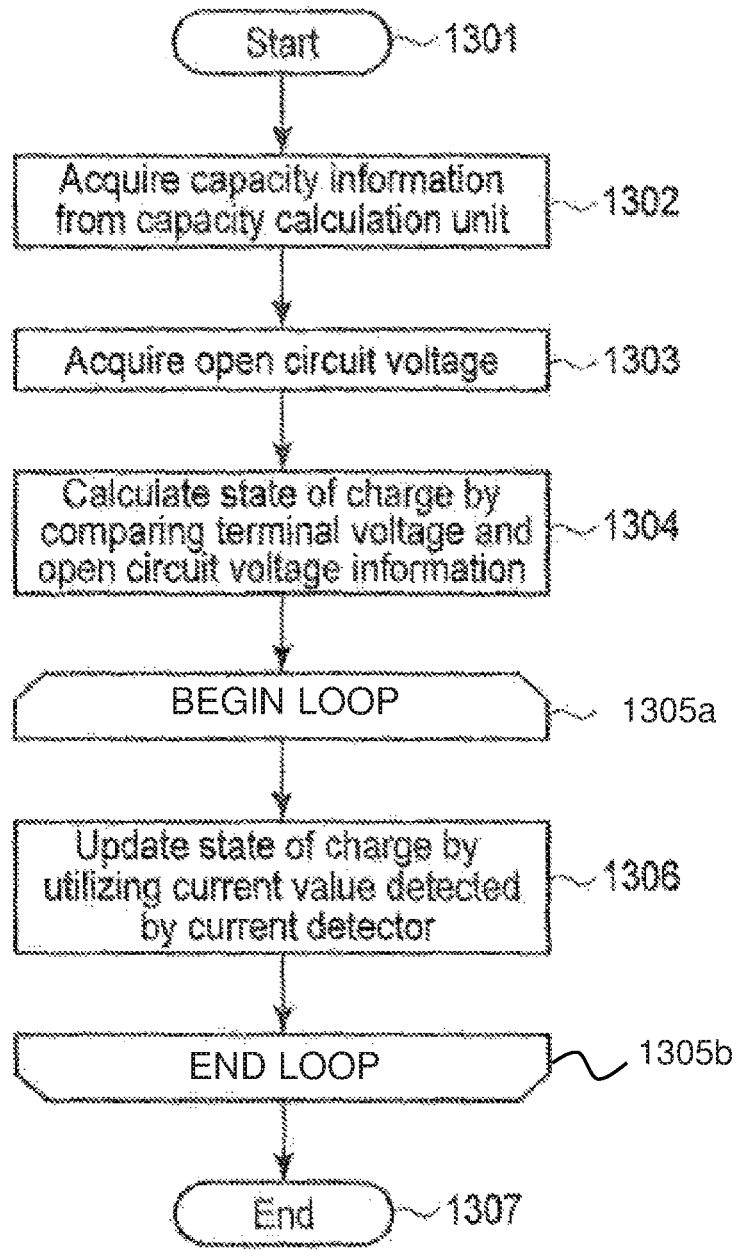
FIG. 11 is a flowchart showing processing of a state-of-charge calculation unit according to the second embodiment.

FIG. 11 shows a flow of processing of the state-of-charge calculation unit 110. The state-of-charge calculation unit 110 starts processing from step 1301, acquires information about the capacity from the capacity calculation unit 109 in step 1302, and acquires a function indicating a relationship between the open circuit voltage and the charged capacity from the open circuit voltage calculation unit 108 in step 1303.

Next, in step 1304, the state-of-charge calculation unit 110 calculates an initial value SOC (0) of the state of charge from the terminal voltage detected by the voltage detector 104 and the function indicating the relationship between the open circuit voltage and the charged capacity acquired in step 1303 by using formula 4 and formula 5.

$$q_0 = g(E_{bat}) \quad \text{(formula 4)}$$

g( ) . . . inverse function of a function indicating a relationship between the open circuit voltage and the charged capacity cell terminal voltage in the unloaded state $E_{bat}$ . . . cell terminal voltage in the unloaded state $$SOC(0) = \frac{q_0}{FCC} \quad \text{(formula 5)}$$

FCC . . . capacity calculated by the capacity calculation unit

The state-of-charge calculation unit 110 keeps updating the state of charge by repeating the processing of step 1306 in the loop 1305a-1305b until charge/discharge is terminated. The process is terminated in step 1307.

In step 1306, the state-of-charge calculation unit 110 calculates the state of charge SOC (t) at time t by using formula 6.

$$SOC(t) = SOC(t-1) + \frac{I_t \Delta t}{FCC} \quad \text{(formula 6)}$$

Δt . . . elapsed time from time t−1 to t

As described above, according to the second embodiment, it is possible to accurately calculate the state of charge of the secondary cell by using a capacity and a relationship between the open circuit voltage and the charged capacity of the secondary cell, which changes with time.

Third Embodiment

In general, although a battery is utilized in a form of an assembled battery formed by connecting a plurality of cells to each other, each of the cells included in the assembled battery varies in capacity for such reasons as unevenness in quality at the time of manufacture or unevenness in state of deterioration caused by temperature variation at the time of use. Thus, in a third embodiment, an estimate of the open circuit voltage of each of the cells included in the assembled battery is carried out.

Figure 12:
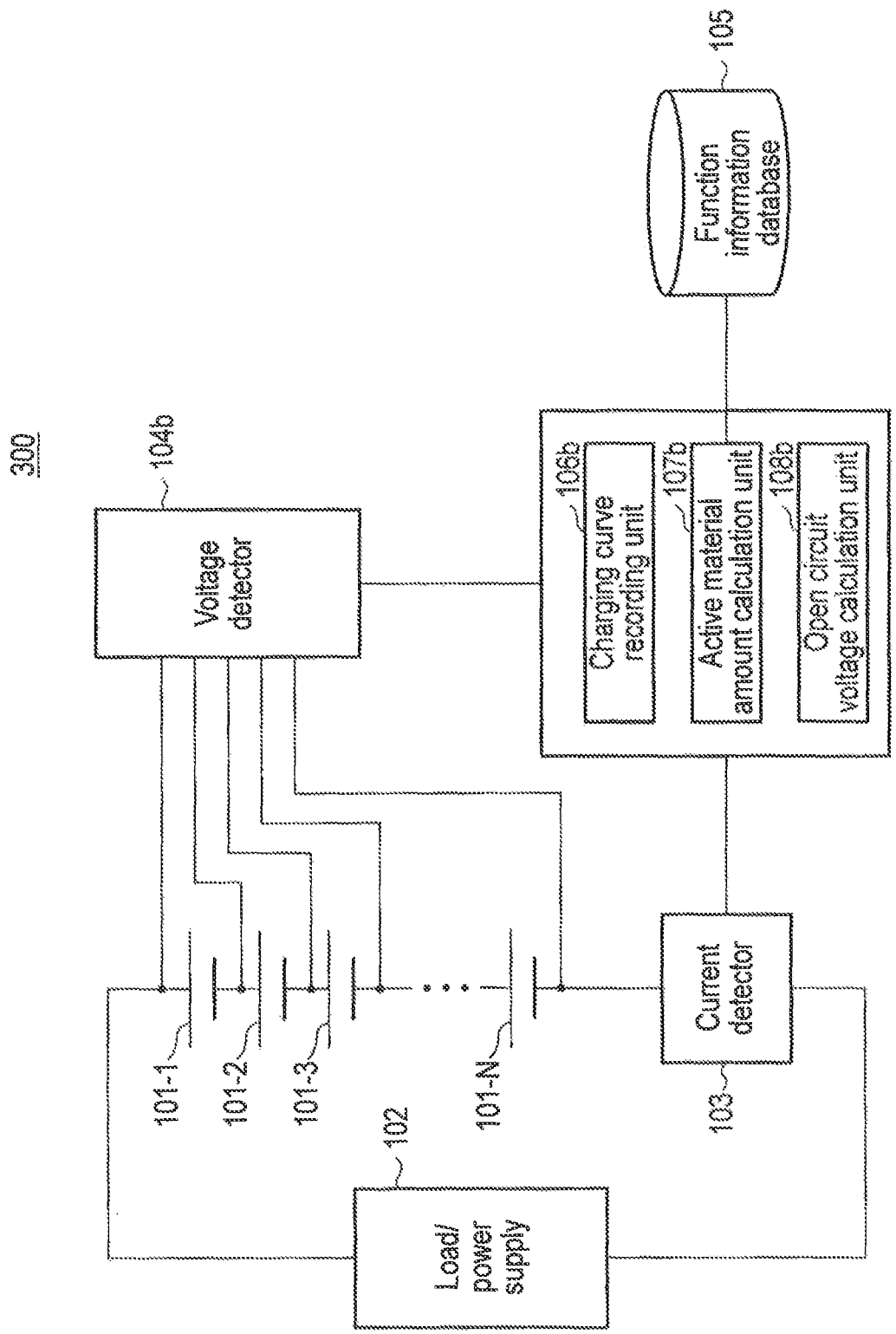
FIG. 12 is a block diagram showing the configuration of a cell state calculation apparatus according to a third embodiment.

FIG. 12 is a view showing the configuration of a cell state calculation apparatus according to the third embodiment. A cell state calculation apparatus 300 shown in FIG. 12 includes N secondary cells 101-1 to 101-N connected in series, a load or power supply 102, a current detector 103, a voltage detector 104b, a function information database 105, a charging curve recording unit 106b, an active material amount calculation unit 107b, and an open circuit voltage calculation unit 108b. It should be noted that in the cell state calculation apparatus 300, components denoted by using the reference numerals identical to those in FIG. 1 shown in the first embodiment are identical to the first embodiment, and hence a detailed description of them are omitted here.

The cell state calculation apparatus 300 shown in FIG. 12 differs from the cell state calculation apparatus 100 in that the apparatus 300 has the configuration in which N secondary batteries 101-1 to 101-N are connected in series. In the current detector 103, a current flowing through the cells connected in series is measured at one position, and hence the configuration of the current detector 103 is identical to the current detector 103 in the cell state calculation apparatus 100. On the other hand, the voltage detector 104b measures a voltage between a cathode terminal and an anode terminal of each of the N secondary cells (also referred to as cells, hereinafter) 101-1 to 101-N.

Figure 13:
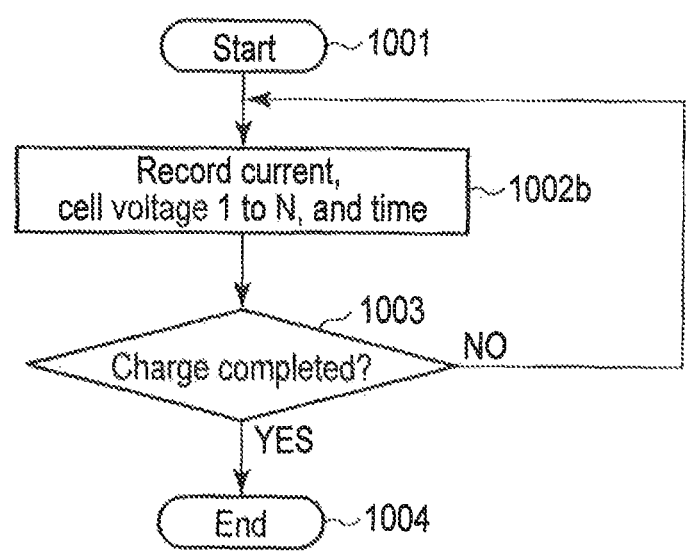
FIG. 13 is a flowchart showing processing of a charging curve recording unit according to the third embodiment.

The charging curve recording unit 106b records a current and a voltage of each cell at the time of charge or at the time of discharge. FIG. 13 shows a flow of processing of the charging curve recording unit 106b. A difference in processing between the charging curve recording unit 106b the and charging curve recording unit 106 shown in the above first embodiment is that a voltage of each of the cells is recorded in step 1002b.

The active material amount calculation unit 107b carries out the processing of the active material amount calculation unit 107 shown in the above first embodiment for each of charging histories of the secondary cells 101-1 to 101-N, and calculates a parameter set including N sets of cathode initial charged capacities, cathode mass values, anode initial charged capacities, anode mass values, and internal resistance values.

The open circuit voltage calculation unit 108b carries out the processing of the open circuit voltage calculation unit 108 shown in the above first embodiment for each of the secondary cells 101-1 to 101-N, and calculates N sets of functions each indicating a relationship between the open circuit voltage and the charged capacity.

Therefore, according to the third embodiment, it is possible to accurately grasp a relationship between the open circuit voltage and the charged capacity, and a capacity of each of the battery cells included in the assembled battery, the relationship and the capacity changing with use.

Fourth Embodiment

In a fourth embodiment, the capacity and the state of charge of each of cells included in an assembled battery are calculated by using the relationship between the open circuit voltage and the charged capacity of each of the cells in the assembled battery calculated in the third embodiment.

FIG. 14 is a view showing the configuration of a cell state calculation apparatus according to the fourth embodiment. A cell state calculation apparatus 400 shown in FIG. 14 includes N secondary cells 101-1 to 101-N connected in series, a load or power supply 102, a current detector 103, a voltage detector 104b, a function information database 105, a charging curve recording unit 106b, an active material amount calculation unit 107b, an open circuit voltage calculation unit 108b, a capacity calculation unit 109b, a state-of-charge calculation unit 110b, and a display unit 111. It should be noted that in the cell state calculation apparatus 400, components denoted by using the reference numerals identical to the cell state calculation apparatus 200 shown in the above second embodiment or the cell state calculation apparatus 300 shown in the above third embodiment are identical to the second embodiment or the third embodiment, and hence a detailed description of them are omitted here.

The capacity calculation unit 109b calculates N capacities of the N secondary cells 101-1 to 101-N. The capacity calculation unit 109b calculates, for each of the N cells 101-1 to 101-N, the capacity based on the relationship between the open circuit voltage and the charged capacity of the cell calculated by the open circuit voltage calculation unit 108*b* of the above third embodiment.

The state-of-charge calculation unit 110*b* carries out the processing of the state-of-charge calculation unit 110 shown in the above second embodiment for each of the secondary cells 1011 to 101-N, calculates the N states of charge, and outputs them to the display unit 111.

The display unit 111 is a display device such as a CRT, LCD or the like, and displays the state of charge of each of the cells calculated by the state-of-charge calculation unit 110*b* on the screen in numerical figures or by color. It should be noted that the capacity of each of the cells may be displayed as the need arises.

According to the fourth embodiment, it is possible to accurately grasp the state of charge of each of the cells included in the assembled battery.

Fifth Embodiment

The above fourth embodiment is configured to calculate the open circuit voltage and the capacity after carrying out charge of the secondary cell, and estimate the state of charge by using the calculated information. In a fifth embodiment, the information about an open circuit voltage and the capacity calculated at the previous charge time is stored, and an estimate of the state of charge is carried out by using this information until the next charge is carried out.

FIG. 15 is a view showing the configuration of a cell state calculation apparatus according to the fifth embodiment. A cell state calculation apparatus 500 shown in FIG. 15 is an apparatus formed by adding an open circuit voltage/capacity storage unit 112 to the cell state calculation apparatus 400 shown in the above fourth embodiment.

An open circuit voltage calculation unit 108*c* carries out the processing of the open circuit voltage calculation unit 108 shown in the above first embodiment for each of secondary cells 101-1 to 101-N, calculates N sets of functions each indicating a relationship between the open circuit voltage and the charged capacity, and stores the calculation results in the open circuit voltage/capacity storage unit 112.

A capacity calculation unit 109*c* calculates N values of capacity based on the relationship between the open circuit voltage and the charged capacity calculated for each of the secondary cells 101-1 to 101-N by the open circuit voltage calculation unit 108*b* of the above third embodiment, and stores the calculation results in the open circuit voltage/capacity storage unit 112.

Figure 16:
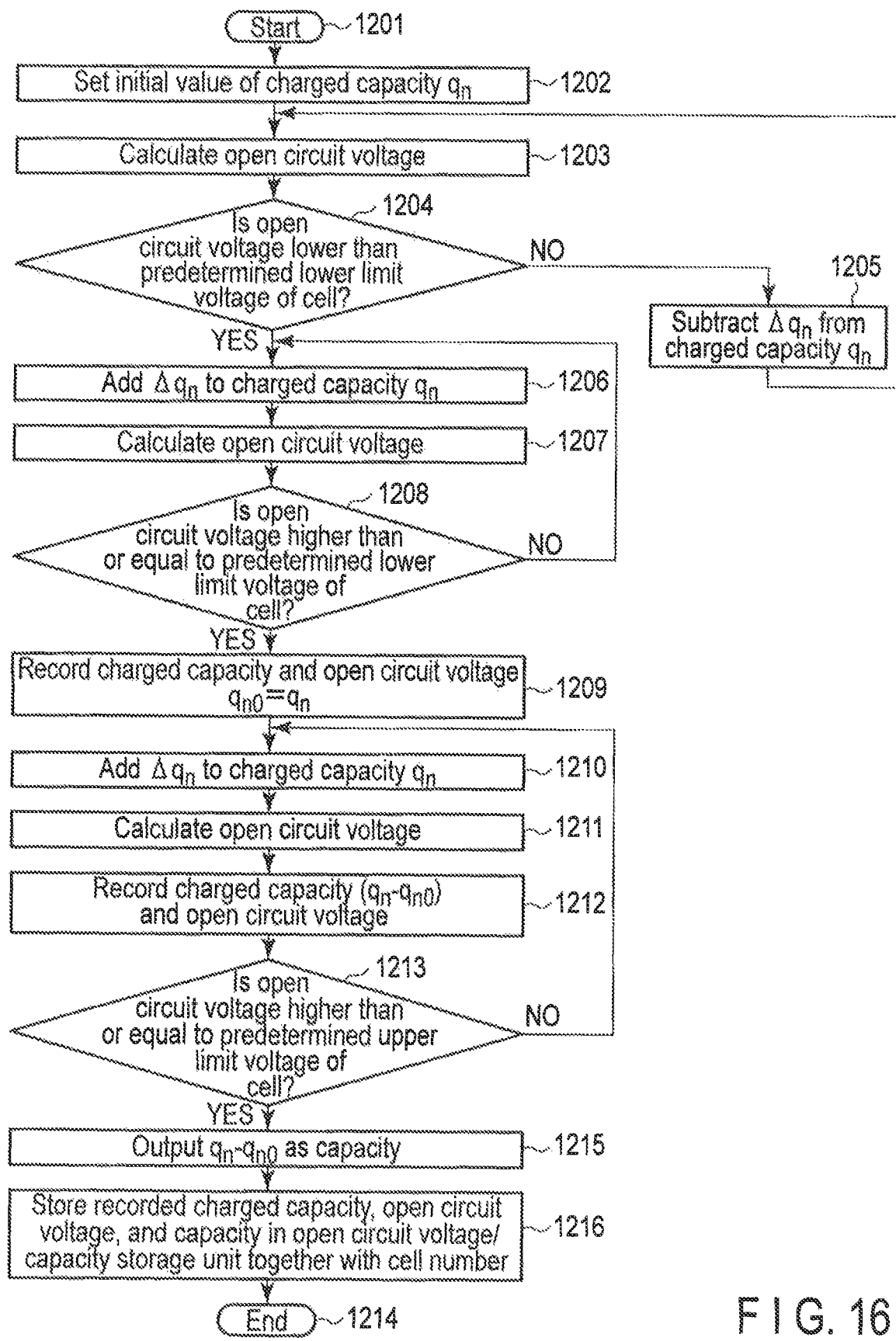
FIG. 16 is a flowchart showing processing of an open circuit voltage calculation unit and a capacity calculation unit according to the fifth embodiment.

FIG. 16 shows a flow of processing of the open circuit voltage calculation unit 108*c* and the capacity calculation unit 109*c*. The difference from the capacity calculation unit 109 shown in the above second embodiment and the capacity calculation unit 109*b* shown in the above fourth embodiment is that step 1216 is added to the processing. In step 1216, the open circuit voltage calculation unit 108*c* and the capacity calculation unit 109*c* associate the function indicating a relationship between the open circuit voltage and the calculated charged capacity, and calculated capacity with each of cell numbers (1 to N), and store the resultant in the open circuit voltage/Capacity storage unit 112.

A state-of-charge calculation unit 110*c* calculates, for each of the secondary cells 101-1 to 101-N, a state of charge of the secondary cell by using the relationship between the open circuit voltage and the charged capacity calculated by the open circuit voltage calculation unit 108*c*, and capacity of the cell calculated by the open circuit voltage calculation unit 108*e* and the capacity calculation unit 109*c*, and stored in the open circuit voltage/capacity storage unit 112.

Figure 17:
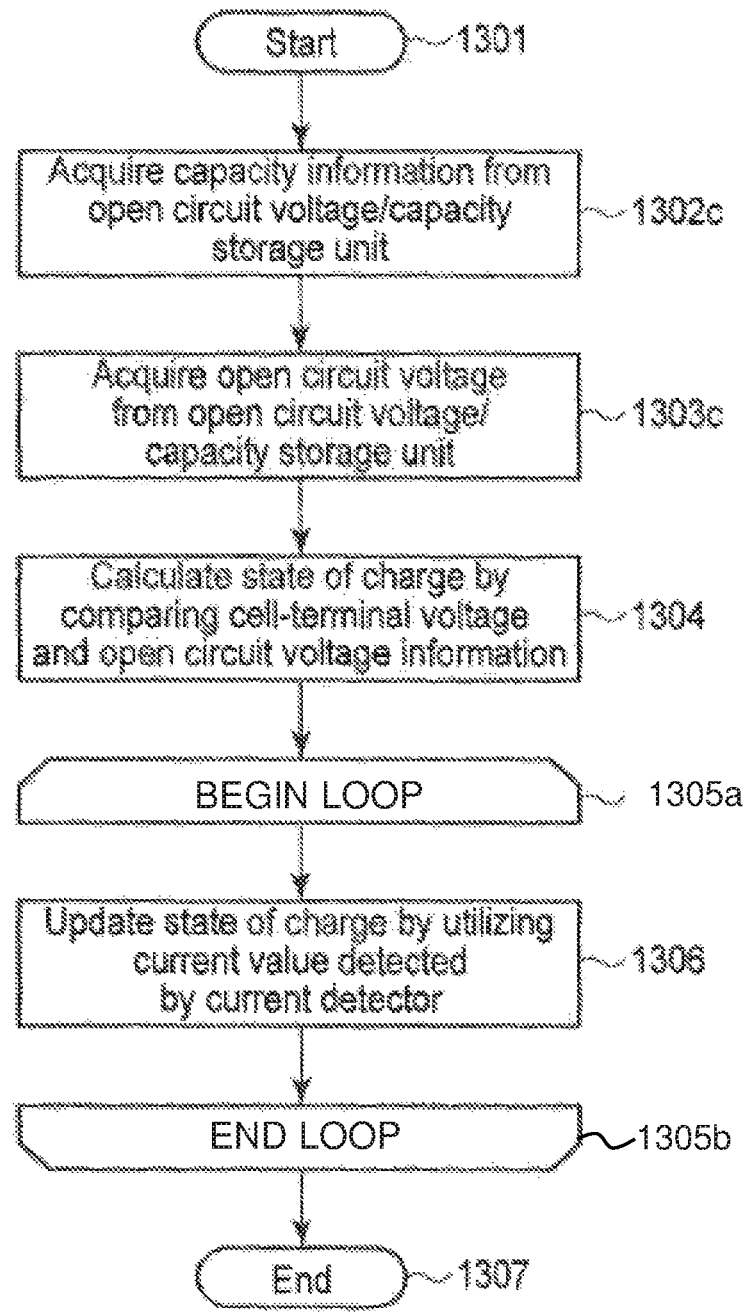
FIG. 17 is a flowchart showing processing of a state-of-charge calculation unit according to the fifth embodiment.

FIG. 17 shows a flow of processing of the state-of-charge calculation unit 110*c*. When the processing of the capacity calculation unit 109*e* is completed and/or the execution of the cell state calculation apparatus 500 is started, the state-of-charge calculation unit 110*c* starts processing from step 1301. More specifically, the processing is executed when use of the battery preserved in the charged state is started other than when charge is completed. The difference from the state-of-charge calculation unit 110 shown in the example of the above second embodiment and the state-of-charge calculation unit 110*b* shown in the above fourth embodiment is that in step 1302*c* and step 1303*c*, the information about the capacity and the open circuit voltage is acquired from the open circuit voltage/capacity storage unit 112. That is the state-of-charge calculation unit 110*c* can quickly calculate the state of charge by using the information about the capacity and the open circuit voltage stored in the open circuit voltage/capacity storage unit 112 until the next charge is carried out.

Therefore, according to the above fifth embodiment, even when the secondary cell is not continuously used after charge, it is possible to accurately grasp the state of charge of each of the cells including in the assembled battery. It should be noted that an open circuit voltage/capacity storage unit 112 may be added to the cell state calculation apparatus 200 and similar processing may be carried out.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A cell state calculation apparatus comprising:
a voltage detector connected to a cathode terminal and an anode terminal of a secondary cell that detects a terminal voltage;
a current detector connected to at least one of the cathode terminal or the anode terminal, the current detector detecting a current flowing through the secondary cell;
a memory configured to store a first function indicating a relationship between a voltage and a charged capacity of an active material; and
a processing circuitry coupled to the memory, the voltage detector, and the current detector, the processing circuitry being configured to:
receive a voltage measurement, from the voltage detector, and a current measurement, from the current detector, while the secondary cell is charged or discharged;
calculate an initial charged capacity of a cathode of the secondary cell and an initial charged capacity of an anode of the secondary cell based on the first function, the voltage measurement and the current measurement; and
calculate a second function indicating a relationship between an open circuit voltage and a charged capacity of the secondary cell based on the first function, the initial charged capacity of the cathode, and the initial charged capacity of the anode, wherein the memory is further configured to store the second function calculated by the processing circuitry, and the processing circuitry is further configured to calculate a capacity of the secondary cell based on the second function stored in the memory.

2. The apparatus according to claim 1, wherein the processing circuitry is further configured to calculate a state of charge of the secondary cell based on the second function stored in the memory and the calculated capacity.

3. The apparatus according to claim 2, wherein
the memory is further configured to the capacity calculated by the processing circuitry, and the processing circuitry is configured to calculate the state of charge of the secondary cell based on the second function stored in the memory and the capacity stored in the memory.

4. The apparatus according to claim 1, wherein the processing circuitry is configured to calculate the initial charged capacity of the cathode and the initial charged capacity of the anode by referring to the first function and performing regression calculation with the initial charged capacity of the cathode and the initial charged capacity of the anode being set as variables.

5. The apparatus according to claim 1, wherein
the processing circuitry is configured to calculate the capacity by comparing an open circuit voltage indicated by the second function stored in the memory and a predetermined voltage range of the secondary cell.

6. The apparatus according to claim 3, further comprising a display unit configured to display the capacity or the state of charge of the secondary cell.

7. The apparatus according to claim 1, wherein
the secondary cell is an assembled battery comprising a plurality of cells, the detecting the terminal voltage of the secondary cell comprises detecting the terminal voltage of each of the plurality of cells, the calculating the initial charged capacity of the cathode of the secondary cell and the initial charged capacity of the anode of the secondary cell comprises calculating the initial charged capacity of the cathode of each of the plurality of cells, and the initial charged capacity of the anode of each of the plurality of cells, and the calculating the second function comprises calculating, for each of the plurality of cells, the second function based on the first function, the initial charged capacity of the cathode of each of the plurality of cells, and the initial charged capacity of the anode of each of the plurality of cells.

8. The apparatus according to claim 7, wherein the processing circuitry is further configured to calculate a capacity of each of the plurality of cells based on the second function calculated for each of the plurality of cells.

9. The apparatus according to claim 8, wherein the processing circuitry is further configured to calculate a state of charge of each of the plurality of cells based on the second function calculated for each of the plurality of cells and the capacity of each of the plurality of cells.

10. The apparatus according to claim 9, wherein the memory is further configured to store the second function calculated for each of the plurality of cells by the processing circuitry and the capacity of each of the plurality of cells calculated by the processing circuitry, and the processing circuitry is configured to calculate the state of charge of each of the plurality of cells based on the second function stored in the memory and the capacity stored in the memory.

11. The apparatus according to claim 7, wherein the processing circuitry is configured to calculate the initial charged capacity of the cathode of each of the plurality of cells and the initial charged capacity of the anode of each of the plurality of cells by referring to the first function and performing regression calculation with the initial charged capacity of the cathode of each of the plurality of cells and the initial charged capacity of the anode of each of the plurality of cells being set as variables.

12. The apparatus according to claim 8, wherein the processing circuitry is configured to calculate the capacity by comparing an open circuit voltage indicated by the second function calculated for each of the plurality of cells and a predetermined voltage range of the secondary cell.

13. The apparatus according to claim 10, further comprising a display unit configured to display the capacity or the state of charge of the secondary cell.

14. A cell state calculation apparatus comprising:
a voltage detector connected to a cathode terminal and an anode terminal of a secondary cell that detects a terminal voltage;

a current detector connected to at least one of the cathode terminal or the anode terminal, the current detector detecting a current flowing through the secondary cell;

a memory configured to store an initial charged capacity of the cathode of a secondary cell and an initial charged capacity of the anode of the secondary cell; and a processing circuitry coupled to the memory, the voltage detector, and the current detector, the processing circuitry being configured to:

receive a voltage measurement, from the voltage detector, and a current measurement, from the current detector, while the secondary cell is charged or discharged; and calculate a function indicating a relationship between an open circuit voltage and a charged capacity of the secondary cell within a predetermined voltage range of the initial charged capacity of the cathode stored in the memory and the initial charged capacity of the anode stored in the database, wherein the memory is further configured to store the function calculated by the processing circuitry, and
the processing circuitry is further configured to calculate a capacity of the secondary cell based on the second function stored in the memory.

15. A cell state calculation method comprising:
detecting a terminal voltage of a secondary cell, with a voltage detector connected to a cathode terminal and an anode terminal of the secondary cell, while the secondary cell is charged or discharged;

detecting a current flowing through the secondary cell, with a current detector connected to at least one of the cathode terminal or the anode terminal, while the secondary cell is charged or discharged;

calculating an initial charged capacity of a cathode of the secondary cell and an initial charged capacity of an anode of the secondary cell based on a first function, the terminal voltage, and the current detected, the first function indicating a relationship between a voltage and a charged capacity of an active material;

calculating a second function indicating a relationship between an open circuit voltage and a charged capacity of the secondary cell based on the first function, the initial charged capacity of the cathode, and the initial charged capacity of the anode;

storing the calculated second function in a memory; and calculating a capacity of the secondary cell based on the second function stored in the memory.

16. The apparatus according to claim 1, wherein the open circuit voltage represents a difference between a potential at the cathode and a potential at the anode.

17. The apparatus according to claim 1, wherein the calculating the second function comprises:

calculating a value of the open circuit voltage of the secondary cell based on the first function, the initial charged capacity of the cathode, the initial charged capacity of the anode, and a value of the charged capacity of the secondary cell; and comparing the calculated value of the open circuit voltage with a predetermined lower limit voltage of the secondary cell.

18. The apparatus according to claim 17, wherein the calculating the second function further comprises:

adding a predetermined value to the value of the charged capacity of the secondary cell to obtain a new value of the charged capacity of the secondary cell when the calculated value of the open circuit voltage is lower than the predetermined lower limit voltage of the secondary cell;

calculating a new value of the open circuit voltage of the secondary cell based on the first function, the initial charged capacity of the cathode, the initial charged capacity of the anode, and the new value of the charged capacity of the secondary cell; and comparing the calculated new value of the open circuit voltage with the predetermined lower limit voltage of the secondary cell.

\* \* \* \* \*